US008674251B2

(12) United States Patent
Chang

(10) Patent No.: US 8,674,251 B2
(45) Date of Patent: Mar. 18, 2014

(54) SINGLE SIDE TOUCH PANEL STRUCTURE AND MANUFACTURING METHOD THEREOF

(75) Inventor: Chih-Shun Chang, Linkou Township, Taipei County (TW)

(73) Assignee: Fortrend Taiwan Scientific Corp., Taipei County (TW)

(*) Notice: Subject to any disclaimer, the term of this patent is extended or adjusted under 35 U.S.C. 154(b) by 317 days.

(21) Appl. No.: 13/175,907

(22) Filed: Jul. 4, 2011

(65) Prior Publication Data

US 2013/0008770 A1    Jan. 10, 2013

(51) Int. Cl.
*H03K 17/975* (2006.01)
(52) U.S. Cl.
USPC ........................................... 200/600
(58) Field of Classification Search
USPC ............ 200/600, 262, 5 R, 5 A, 46, 511, 512, 200/514, 515, 266–269, 278, 308, 310–313, 200/292, 513, 516, 517, 314, 317; 345/173–176; 428/1.1–1.62
See application file for complete search history.

(56) References Cited

U.S. PATENT DOCUMENTS

| | | | | |
|---|---|---|---|---|
| 7,758,225 B2* | 7/2010 | Jung et al. | ...................... | 362/602 |
| 7,830,366 B2* | 11/2010 | Tanabe et al. | ................. | 345/173 |
| 7,864,503 B2* | 1/2011 | Chang | ........................... | 361/288 |
| 8,040,321 B2 | 10/2011 | Peng et al. | ..................... | 345/169 |
| 8,279,201 B2* | 10/2012 | Kang et al. | ..................... | 345/176 |
| 2009/0159417 A1* | 6/2009 | Lin et al. | ........................ | 200/600 |
| 2011/0096005 A1* | 4/2011 | Kim et al. | ...................... | 345/173 |
| 2011/0102370 A1* | 5/2011 | Kono et al. | ................... | 345/174 |

FOREIGN PATENT DOCUMENTS

TW    M378433    4/2010

* cited by examiner

*Primary Examiner* — Edwin A. Leon
*Assistant Examiner* — Anthony R. Jimenez

(57) ABSTRACT

A single side touch panel structure is provided, which includes a substrate, and a mask layer, a first transparent conducting layer, an insulating layer, and a second transparent conducting layer, wherein the mask layer, the first transparent conducting layer, the insulating layer, and the second transparent conducting layer are from bottom to top sequentially formed on the substrate. The first transparent conducting layer has a plurality of the first patterns, and the second transparent conducting layer has a plurality of the second patterns. The first patterns are arranged in series along a first direction. The second patterns are arranged in series along a second direction that intersects the first direction at an angle. The first and second patterns cross each other, and are separated from each other by the insulating layer. Therefore, a plurality of capacitors are formed at the intersections between the first and second patterns.

18 Claims, 6 Drawing Sheets

SINGLE SIDE TOUCH PANEL STRUCTURE AND MANUFACTURING METHOD THEREOF

BACKGROUND OF THE INVENTION

1. Field of the Invention

The present invention relates to a touch panel and manufacturing method thereof, and more particularly to a single side touch panel structure without a linking bridge structure.

2. The Prior Arts

A conventional capacitive touch panel usually includes an insulating layer formed on a transparent conducting layer defining signal lines in X and Y directions, and a metal layer formed on the insulating layer, and the metal layer can serve as a linking bridge structure to serially connect the signal lines at the crossing intersections along the X and Y directions, as disclosed in Taiwan Patent No. M378433.

However, the disadvantage of the prior art structure is that a lot of photomasks are required to form the linking bridge structure on the insulating layers, which increases the manufacturing cost. Moreover, when the insulating layer is poorly formed, a connection failure occurs at the intersections, which causes the failure of the touch function of the touch panel. In addition, the linking bridge structure is easily subjected to cracks, which greatly reduces the good yield.

Therefore, there is a need for a single side touch panel structure without a linking bridge structure.

SUMMARY OF THE INVENTION

One aspect of the present invention is to provide a single side touch panel structure and manufacturing method thereof. The single side touch panel structure of the present invention comprises a substrate, a mask layer, a first transparent conducting layer, an insulating layer, and a second transparent conducting layer, wherein the mask layer, the first transparent conducting layer, the insulating layer, and the second transparent conducting layer are from bottom to top sequentially formed on the substrate. The first transparent conducting layer has a plurality of first patterns, and the second transparent conducting layer has a plurality of second patterns. The mask layer is used to shield the incoming light, and has a mask pattern so that a portion of the first transparent conducting layer can contact with the substrate.

The first patterns are arranged in series along a first direction. The second patterns are arranged in series along a second direction that intersects the first direction at an angle. The first and second patterns cross each other, and are separated from each other by the insulating layer. Therefore, a plurality of capacitors are formed at the intersections between the first and second patterns, and the capacitance can be changed when a finger touch was made.

The angle defined between the first and second directions can be less than 90 degrees, equal to 90 degrees, or greater than 90 degrees.

Each of the first patterns comprises a plurality of the first body portions and first connecting portions, and two neighboring first body portions are connected with each other via one first connecting portion. In other words, the first body portions and the first connecting portions are alternatively connected to each other. Each of the second patterns comprises a plurality of second body portions and second connecting portions, two neighboring second body portions are connected with each other via one of the second connecting portions. In other words, the second body portions and the second connecting portions are alternatively connected to each other. The second connecting portions are respectively located above the corresponding first connecting portions, and are separated from the first connecting portions by an insulating layer. The first and second body portions can include square shapes, rectangular shapes, lozenge shapes, circular shapes, elliptical shapes or polygonal shapes, and the first and second connecting portions each can have a strip shape.

Accordingly, the single side touch panel structure does not need any bridging structure, and can use the different transparent conducting layers to form the capacitors of the touch panel. As a result, the structure can be simplified, and the reliability of the single side touch panel structure can be improved.

Another aspect of the present invention is to provide a method for manufacturing a single side touch panel structure, comprising: forming a mask layer with a mask pattern on a substrate to partially expose the upper surface of the substrate; forming a first transparent conducting layer on the mask layer and the exposed upper surface of the substrate, wherein the first transparent conducting layer has a plurality of first patterns that are arranged in series along a first direction; forming an insulating layer on the first transparent conducting layer; and forming a second transparent conducting layer on the insulating layer, wherein the second transparent conducting layer has a plurality of second patterns that are arranged in series along a second direction that intersects the first direction at an angle. The first and second patterns cross each other, and are separated by an insulating layer, and thereby a plurality of capacitors are respectively formed at the plurality of intersections between the first and second patterns.

Accordingly, the methods described herein can reduce the number of photomasks, and the insulating layer can cover the entire substrate to prevent the occurrence of short-circuits due to the poor etch or poor exposure.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 1:
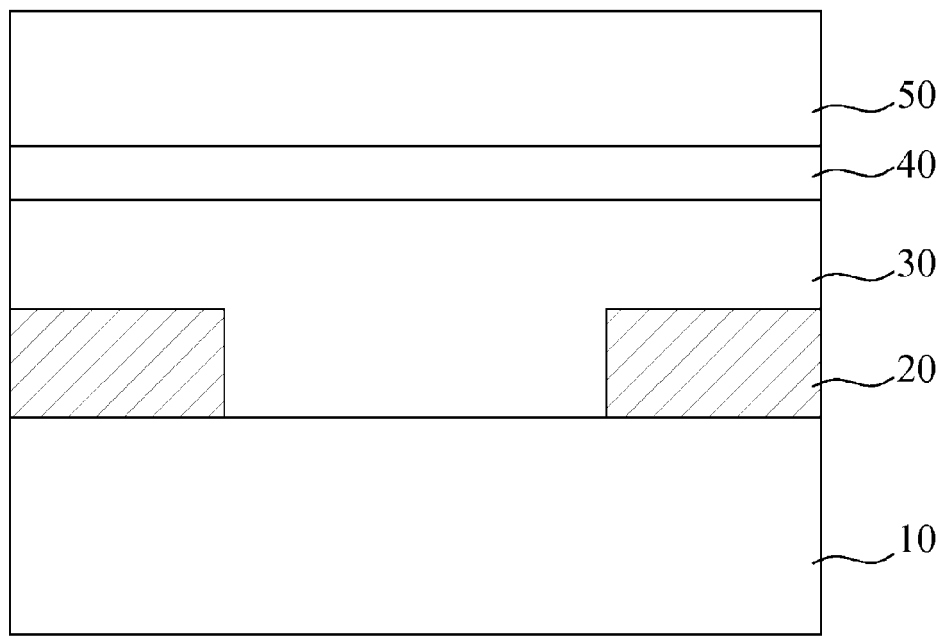
FIG. 1 is a schematic view of a single side touch panel structure according to one embodiment of the present invention.

FIG. 1 is a schematic view of a single side touch panel structure according to one embodiment of the present invention. As shown in FIG. 1, the single side touch panel structure comprises a substrate 10, a mask layer 20, a first transparent conducting layer 30, an insulating layer 40, and a second transparent conducting layer 50, wherein the mask layer 20, the first transparent conducting layer 30, the insulating layer 40, and the second transparent conducting layer 50 are from bottom to top sequentially formed on the substrate 10. The substrate 10 can be a glass substrate, and a display device (not shown) can be disposed under the substrate 10, and the display device can be a liquid crystal display, a plasma display, an electroluminescent display, or a light-emitting diode display for displaying the images.

The mask layer 20 is made of an opaque material. The mask layer 20 can be a black color layer used to shield the light emitted from the display device disposed under the substrate 10. Moreover, the mask layer 20 is patterned to partially expose the substrate 10. The first transparent conducting layer 30 is formed on the mask layer 20 and the exposed portion of the substrate 10. The insulating layer 40 is formed on the first transparent conducting layer 30. The second transparent conducting layer 50 is formed on the insulating layer 40. The first and second transparent conducting layers 30 and 50 can be made of indium tin oxide (ITO), and the insulating layer 40 can be made of silicon dioxide ($SiO_2$).

Figure 2:
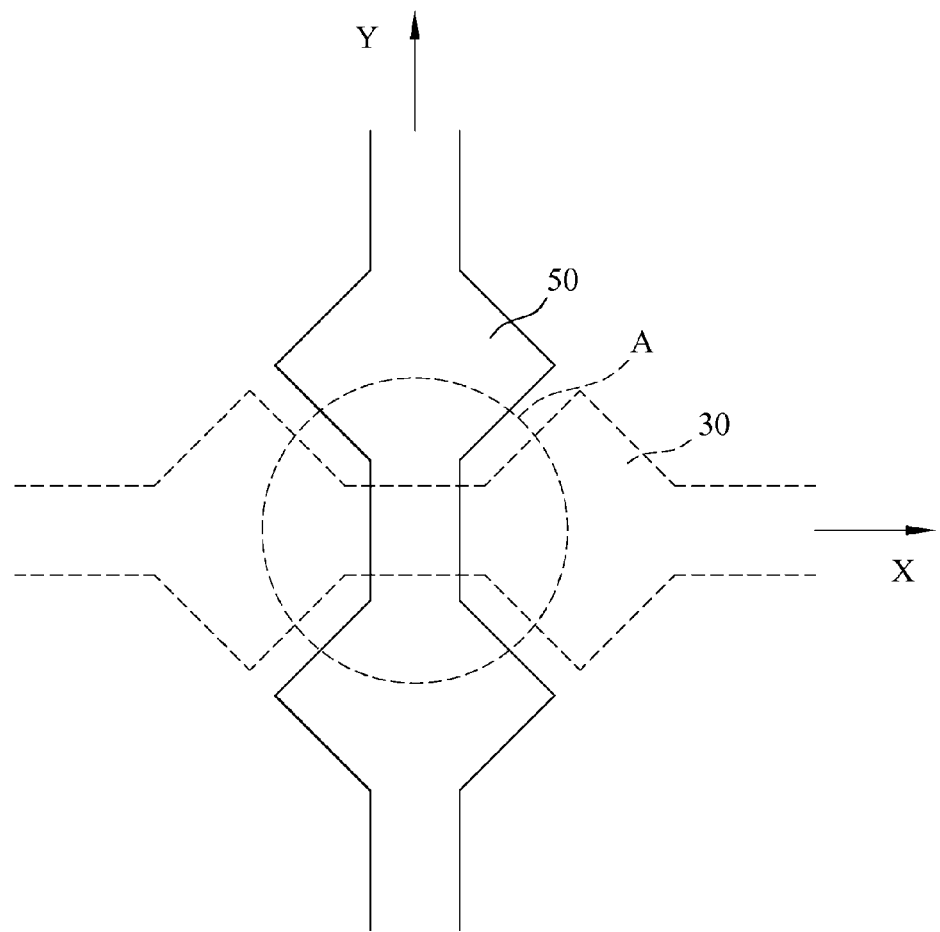
FIG. 2 is a top side view of a single side touch panel structure according to one embodiment of the present invention.
Figure 3:
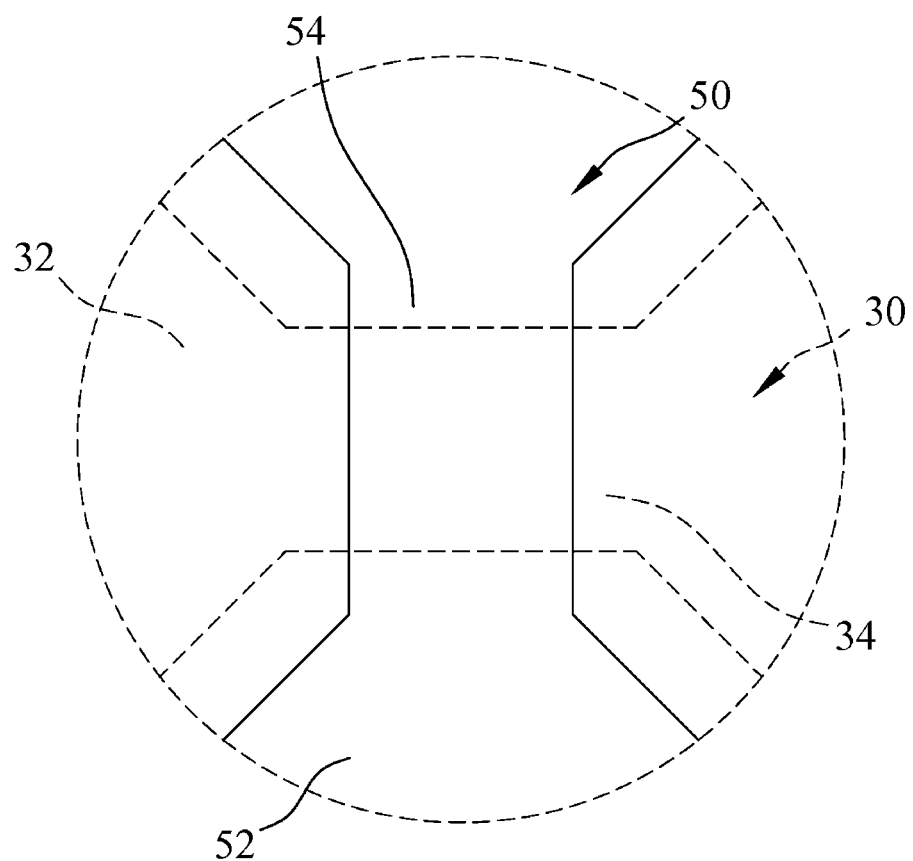
FIG. 3 is a partially enlarged view of FIG. 2.

FIGS. 2 and 3 are respectively the top side view and the partially enlarged view of the single side touch panel structure of the present invention. The first transparent conducting layer 30 has a plurality of first patterns that are arranged in series along a first direction X. The second transparent conducting layer 50 has a plurality of second patterns that are arranged in series along a second direction Y that intersects the first direction X at an angle which can be less than 90 degrees, equal to 90 degrees, or greater than 90 degrees. The angle between the directions X and Y is 90 degrees in this embodiment of the present invention, but the present invention should not be limited to such an angle. The first and second patterns cross each other, and are separated by an insulating layer 40, as shown in region A of FIG. 2.

Each first pattern comprises a plurality of first body portions 32 and a plurality of first connecting portions 34, and two neighboring first body portions 32 are connected with each other via one first connecting portion 34. In other words, the first body portions 32 and the first connecting portions 34 are connected with one another in an alternating manner. Each second pattern comprises a plurality of second body portions 52 and a plurality of second connecting portions 54, and two neighboring second body portions 52 are connected with each other via one second connecting portion 54. In other words, the second body portions 52 and the second connecting portions 54 are connected with one another in an alternating manner. The second connecting portions 54 are respectively disposed above the first connecting portions 34. Moreover, the first and second connecting portions 34 and 54 are located at the intersections between the first and second patterns, and are vertically separated from each other by the insulating layer 40 (as shown in FIG. 1). Therefore, the first connecting portions 34, the insulating layer 40, and the second connecting portions 54 form the capacitors whose capacitance values are modified when the second connecting portions 54 are pressed. The capacitive touch panel can be thereby provided.

The first and second body portions 32 and 52 can have square shapes, rectangular shapes, lozenge shapes, circular shapes, elliptical shapes, or polygonal shapes. Moreover, the first and second connecting portions 34 and 54 each can have a strip shape.

Figure 4:
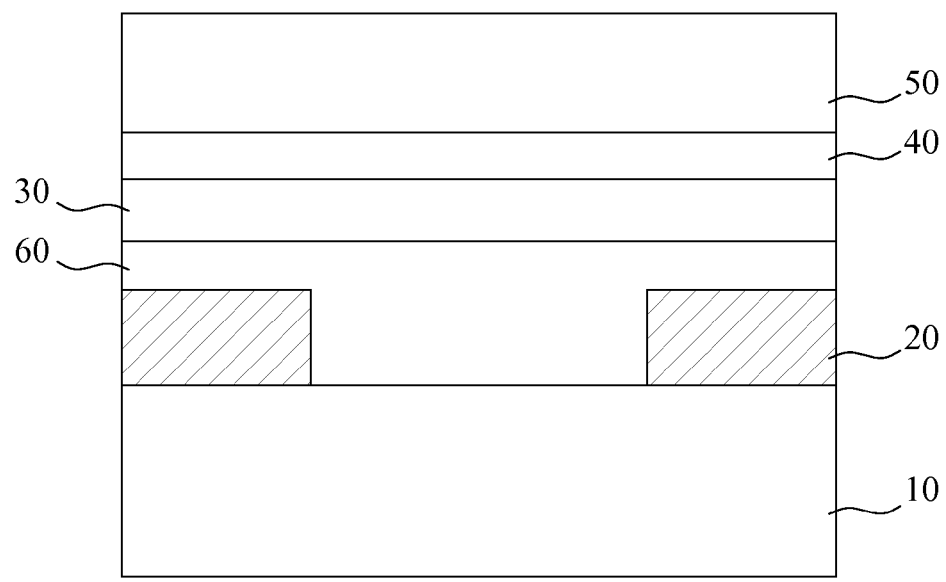
FIG. 4 is a schematic view of a single side touch panel structure according to another embodiment of the present invention.

FIG. 4 is a schematic view of another embodiment of a single side touch panel structure of the present invention. The single side touch panel structure of the present invention of FIG. 4 is similar to that of FIG. 1. The difference is that the single side touch panel structure of FIG. 4 includes an additional buffer layer 60 that is formed below the first transparent conducting layer 30 and above the mask layer 20 and the exposed portion of the substrate 10. The buffer layer 60 is made of an anti-reflective material. The buffer layer 60 can be used as an anti-reflection layer to reduce the reflection of the light emitted from underlying display device, and thereby the light transmittance is increased. Moreover, the buffer layer 60 can also be made of the same material as the insulating layer 40 to form as another insulating layer.

The structures as shown in FIGS. 1 and 4 can further comprise an external connection wiring layer (not shown) formed on the second transparent conducting layer 50 and used to connect to an external device (not shown). This external connection wiring layer can be made of a conducting material, such as silver.

The single side touch panel structure of the present invention does not require any bridging structure. In the single side touch panel structure of the present invention, the first body portions of the first patterns of the first transparent conducting layer are connected with one another via the first connecting portions. Likewise, the second body portions of the second patterns of the second transparent conducting layer are connected with one another via the second connecting portions. Furthermore, the first and second patterns cross each other, and are separated by an insulating layer.

Figure 5:
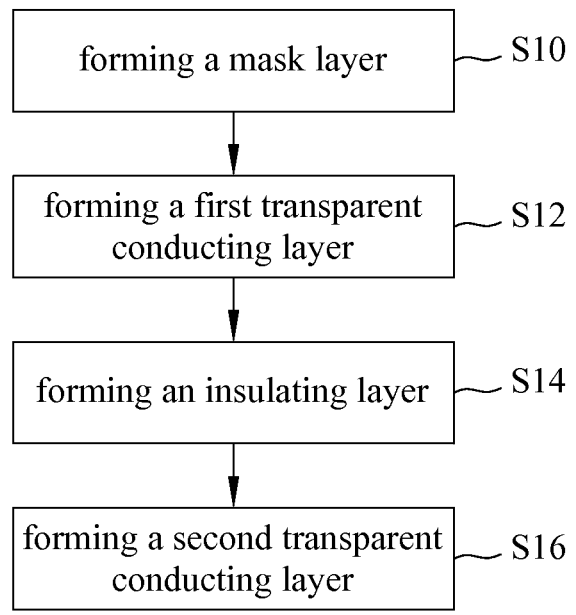
FIG. 5 is a flowchart of a method for manufacturing the single side touch panel structure according to one embodiment of the present invention.

FIG. 5 is a flowchart showing a method for manufacturing the single side touch panel structure of the present invention. In step S10, a mask layer is formed on the substrate, and the mask layer has a mask pattern so that the substrate is partially exposed. The mask pattern can be formed by etching.

In step S12, the first transparent conducting layer is formed on the mask layer and the exposed portion of the substrate. The first transparent conducting layer has a plurality of first patterns that are arranged in series along a first direction. The first patterns include a plurality of the first body portions and a plurality of the first connecting portions, and the two neighboring first body portions are connected with each other via one first connecting portion. In other words, the first body portions and the first connecting portions are connected with one another in an alternating manner.

In step S14, an insulating layer is formed on the first transparent conducting layer. In step S16, a second transparent conducting layer is formed on the insulating layer. The second transparent conducting layer has a plurality of second patterns that are arranged in series along a second direction. The second patterns include a plurality of the second body portions and a plurality of the second connecting portions, and the two neighboring second body portions are connected with each other via one second connecting portion. In other words, the second body portions and the second connecting portions are connected with one another in an alternating manner.

Figure 6:
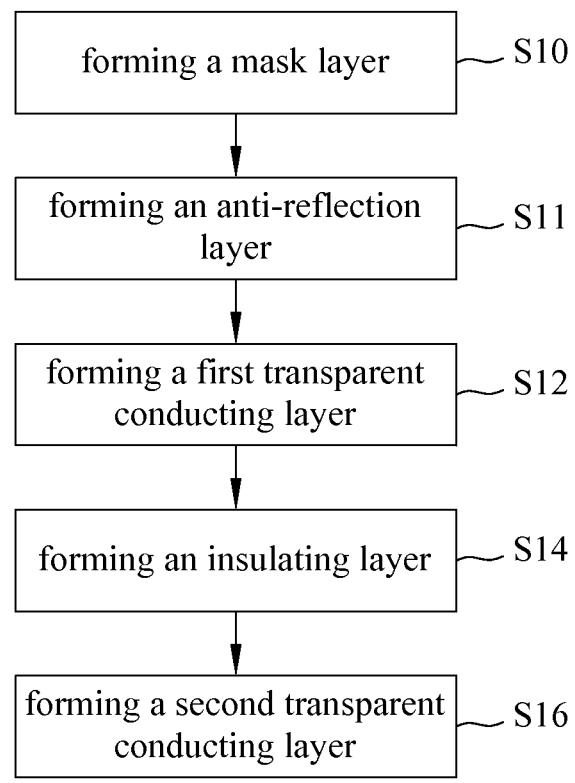
FIG. 6 is a flowchart of a method for manufacturing the single side touch panel structure according to another embodiment of the present invention.

FIG. 6 is a flowchart of another method for manufacturing a single side touch panel structure. The flowchart of FIG. 6 includes an additional step S11 between steps S10 and S12 to form a buffer layer. The buffer layer is formed on the mask layer and the exposed portion of the substrate. In step S12, the first transparent conducting layer is formed on the buffer layer. The remaining steps are similar to the embodiment as shown in FIG. 5.

FIGS. 5 and 6 can further comprise forming an external connection wiring layer on the second transparent conducting layer, and the external connection wiring layer is used to connect to an external device. This external connection wiring layer can be made of a conducting material, such as silver.

By using the method of the present invention, the number of photomasks applied can be reduced, and the formed patterns can be simplified. Because no bridging structure is required, and the formed insulating layer is formed over the entire surface of the substrate so that the occurrence of short-circuits due to the poor etch or poor exposure can be prevented. The good yield of the product and the operation reliability are thus improved.

The foregoing description is intended to only provide illustrative ways of implementing the present invention, and should not be construed as limitations to the scope of the present invention. While the foregoing is directed to embodiments of the present invention, other and further embodiments of the invention may thus be devised without departing from the basic scope thereof, and the scope thereof is determined by the claims that follow.

What is claimed is:

1. A single side touch panel structure comprising:
   a substrate;
   a mask layer formed on the substrate and made of an opaque material, wherein the mask layer is used to shield light emitted from a display device disposed under the substrate, the mask layer having a mask pattern to partially expose the substrate;
   a first transparent conducting layer formed on the mask layer and an exposed portion of the substrate, wherein the first transparent conducting layer has a plurality of first patterns that are arranged in series along a first direction;
   an insulating layer formed on the first transparent conducting layer; and
   a second transparent conducting layer formed on the insulating layer, wherein the second transparent conducting layer has a plurality of second patterns that are arranged in series along a second direction that intersects the first direction at an angle, the first and second patterns crossing each other, the first and second patterns being separated from each other by the insulating layer, and a plurality of capacitors being formed at intersections between the first and second patterns.

2. The single side touch panel structure according to claim 1, wherein the substrate is a glass substrate, and the first and second transparent conducting layers are made of indium tin oxide (ITO), and the insulating layer is made of silicon dioxide ($SiO_2$).

3. The single side touch panel structure according to claim 1, wherein each of the first patterns comprises a plurality of first body portions and a plurality of first connecting portions, and two neighboring first body portions are connected with each other via one first connecting portion, and wherein each of the second patterns comprises a plurality of second body portions and a plurality of second connecting portions, and two neighboring second body portions are connected with each other via one second connecting portion, and wherein the second connecting portions are respectively disposed above the first connecting portions, and the first and second connecting portions are located at the intersections between the first and second patterns, and are vertically separated from each other by the insulating layer, and wherein the first connecting portions, the insulating layer, and the second connecting portions form a plurality of capacitors whose capacitance values are modified when the second connecting portions are pressed.

4. The single side touch panel structure according to claim 1, wherein the first and second body portions include square shapes, rectangular shapes, lozenge shapes, circular shapes, elliptical shapes, or polygonal shapes, and the first and second connecting portions each have a strip shape.

5. The single side touch panel structure according to claim 1, further comprises an external connection wiring layer on the second transparent conducting layer, and the external connection wiring layer is used to connect to an external device, and the external connection wiring layer is made of a conducting material including silver.

6. A single side touch panel structure comprising:
   a substrate;
   a mask layer formed on the substrate and made of an opaque material, wherein the mask layer is used to shield light emitted from a display device disposed under the substrate, the mask layer having a mask pattern to partially expose the substrate;
   a buffer layer made of silicon dioxide and formed on the mask layer and an exposed portion of the substrate;
   a first transparent conducting layer formed on the buffer layer, wherein the first transparent conducting layer has a plurality of first patterns that are arranged in series along a first direction;
   an insulating layer formed on the first transparent conducting layer; and
   a second transparent conducting layer formed on the insulating layer, wherein the second transparent conducting layer has a plurality of second patterns that are arranged in series along a second direction that intersects the first direction at an angle, the first and second patterns crossing each other, the first and second patterns being separated from each other by the insulating layer, and a plurality of capacitors being formed at intersections between the first and second patterns, the buffer layer serving as an anti-reflection layer or another insulating layer.

7. The single side touch panel structure according to claim 6, wherein the substrate is a glass substrate, and the first and second transparent conducting layers are made of indium tin oxide (ITO), and the insulating layer is made of silicon dioxide ($SiO_2$).

8. The single side touch panel structure according to claim 6, wherein each of the first patterns comprises a plurality of first body portions and a plurality of first connecting portions, and two neighboring first body portions are connected with each other via one first connecting portion, and wherein each of the second patterns comprises a plurality of second body portions and a plurality of second connecting portions, and two neighboring second body portions are connected with each other via one second connecting portion, and wherein the second connecting portions are respectively disposed above the first connecting portions, and the first and second connecting portions are located at the intersections between the first and second patterns, and are vertically separated from each other by the insulating layer, and wherein the first connecting portions, the insulating layer, and the second connecting portions form a plurality of capacitors whose capacitance values are modified when the second connecting portions are pressed.

9. The single side touch panel structure according to claim 6, wherein the first and second body portions include square shapes, rectangular shapes, lozenge shapes, circular shapes, elliptical shapes, or polygonal shapes, and the first and second connecting portions each have a strip shape.

10. The single side touch panel structure according to claim 6, further comprises an external connection wiring layer on the second transparent conducting layer, and the external connection wiring layer is used to connect to an external device, and the external connection wiring layer is made of a conducting material including silver.

11. A method of manufacturing a single side touch panel structure, comprising:
  forming a mask layer on a substrate, wherein the mask layer is made of an opaque material and is used to shield light emitted from a display device disposed under the substrate, the mask layer having a mask pattern formed by etching to partially expose the substrate;
  forming a first transparent conducting layer on the mask layer and an exposed portion of the substrate, wherein the first transparent conducting layer has a plurality of first patterns that are arranged in series along a first direction, and each of the first patterns comprises a plurality of first body portions and a plurality of first connecting portions, and two neighboring first body portions are connected with each other via one first connecting portion;
  forming an insulating layer on the first transparent conducting layer; and
  forming a second transparent conducting layer on the insulating layer, wherein the second transparent conducting layer has a plurality of second patterns that are arranged in series along a second direction, and each of the second patterns comprises a plurality of second body portions and a plurality of second connecting portions, and two neighboring second body portions are connected with each other via one second connecting portion, and wherein the first and second patterns cross each other, and are separated from each other by the insulating layer, and a plurality of capacitors are formed at the intersections between the first and second patterns.

12. The method according to claim 11, wherein the substrate is a glass substrate, and the first and second transparent conducting layers are made of indium tin oxide (ITO), and the insulating layer is made of silicon dioxide ($SiO_2$).

13. The method according to claim 11, wherein the first and second body portions include square shapes, rectangular shapes, lozenge shapes, circular shapes, elliptical shapes, or polygonal shapes, and the first and second connecting portions each have a strip shape.

14. The method according to claim 11, further comprising:
  forming an external connection wiring layer on the second transparent conducting layer, wherein the external connection wiring layer is used to connect to an external device, and is made of a conducting material including silver.

15. A method of manufacturing a single side touch panel structure, comprising:
  forming a mask layer on a substrate, wherein the mask layer is made of an opaque material and is used to shield light emitted from a display device disposed under the substrate, the mask layer having a mask pattern formed by etching to partially expose the substrate;
  forming a buffer layer made of silicon dioxide on the mask layer and an exposed portion of the substrate;
  forming a first transparent conducting layer on the buffer layer, wherein the first transparent conducting layer has a plurality of first patterns that are arranged in series along a first direction, and each of the first patterns comprises a plurality of first body portions and a plurality of first connecting portions, and two neighboring first body portions are connected with each other via one first connecting portion;
  forming an insulating layer on the first transparent conducting layer; and
  forming a second transparent conducting layer on the insulating layer, wherein the second transparent conducting layer has a plurality of second patterns that are arranged in series along a second direction, and each of the second patterns comprises a plurality of second body portions and a plurality of second connecting portions, and two neighboring second body portions are connected with each other via one second connecting portion, and wherein the first and second patterns cross each other, and are separated from each other by the insulating layer, and a plurality of capacitors are formed at the intersections between the first and second patterns.

16. The method according to claim 15, wherein the substrate is a glass substrate, and the first and second transparent conducting layers are made of indium tin oxide (ITO), and the insulating layer is made of silicon dioxide ($SiO_2$).

17. The method according to claim 15, wherein the first and second body portions include square shapes, rectangular shapes, lozenge shapes, circular shapes, elliptical shapes, or polygonal shapes, and the first and second connecting portions each have a strip shape.

18. The method according to claim 15, further comprising:
  forming an external connection wiring layer on the second transparent conducting layer, wherein the external connection wiring layer is used to connect to an external device, and is made of a conducting material including silver.

* * * * *